US012799359B2

(12) United States Patent
Ohira

(10) Patent No.: US 12,799,359 B2
(45) Date of Patent: Nov. 17, 2026

(54) LAMINATE, LAMINATE FOR OUTDOOR USE, AND HARD COAT LAYER-FORMING MATERIAL

(71) Applicant: DEXERIALS CORPORATION, Tochigi (JP)

(72) Inventor: Tomoya Ohira, Tochigi (JP)

(73) Assignee: DEXERIALS CORPORATION, Tochigi (JP)

( * ) Notice: Subject to any disclaimer, the term of this patent is extended or adjusted under 35 U.S.C. 154(b) by 271 days.

(21) Appl. No.: 18/572,476

(22) PCT Filed: Jul. 21, 2022

(86) PCT No.: PCT/JP2022/028346
§ 371 (c)(1),
(2) Date: Dec. 20, 2023

(87) PCT Pub. No.: WO2023/008306
PCT Pub. Date: Feb. 2, 2023

(65) Prior Publication Data

US 2024/0294802 A1 Sep. 5, 2024

(30) Foreign Application Priority Data

Jul. 30, 2021 (JP) ................................ 2021-124950

(51) Int. Cl.
*C09D 183/04* (2006.01)
*C09D 7/61* (2018.01)
(Continued)

(52) U.S. Cl.
CPC ............. *C09D 183/04* (2013.01); *C09D 7/61* (2018.01); *C23C 14/024* (2013.01);
(Continued)

(58) Field of Classification Search
CPC ............. G02B 1/14; G02B 1/11–1/118; C09D 183/00–183/16
See application file for complete search history.

(56) References Cited

U.S. PATENT DOCUMENTS 4,889,901 A * 12/1989 Shama ................ C09D 175/16 526/279
2004/0071986 A1 4/2004 Shoshi et al.
(Continued)

FOREIGN PATENT DOCUMENTS

| | | |
|---|---|---|
| CN | 1493889 | 5/2004 |
| CN | 109196390 | 1/2019 |

(Continued)

OTHER PUBLICATIONS

Machine translation of JP2002-167552. Retrieved May 15, 2026.*
(Continued)

*Primary Examiner* — Prashant J Khatri
(74) *Attorney, Agent, or Firm* — IPUSA, PLLC

(57) ABSTRACT

To provide a laminate including a base, a hard coat layer disposed on the base, and a dry film layer disposed on the hard coat layer. The hard coat layer includes a polysilsesquioxane derivative. An abundance ratio [(Si/C)×100] of silicon atoms Si to carbon atoms C existing at a surface of the hard coat layer facing the dry film layer is 30% or greater.

11 Claims, 2 Drawing Sheets

(51) Int. Cl.

| | |
|---|---|
| ***C23C 14/02*** | (2006.01) |
| ***C23C 14/08*** | (2006.01) |
| ***C23C 14/10*** | (2006.01) |
| ***C23C 14/34*** | (2006.01) |
| ***G02B 1/115*** | (2015.01) |
| ***G02B 1/14*** | (2015.01) |

(52) U.S. Cl.
CPC ............ *C23C 14/083* (2013.01); *C23C 14/10* (2013.01); *C23C 14/34* (2013.01); *G02B 1/115* (2013.01); *G02B 1/14* (2015.01)

(56) References Cited

U.S. PATENT DOCUMENTS

| | | | | |
|---|---|---|---|---|
| 2007/0134424 | A1 | 6/2007 | Tauchi et al. | |
| 2010/0249265 | A1* | 9/2010 | Engardio | G02B 1/105 523/107 |
| 2010/0280210 | A1 | 11/2010 | Kitamura et al. | |
| 2014/0303392 | A1 | 10/2014 | Ogura et al. | |
| 2018/0094161 | A1 | 4/2018 | Lee et al. | |
| 2019/0016932 | A1 | 1/2019 | Munekata et al. | |
| 2019/0227195 | A1 | 7/2019 | Horio et al. | |
| 2020/0062996 | A1 | 2/2020 | Kikuchi | |
| 2020/0243798 | A1 | 7/2020 | Matsushita et al. | |
| 2021/0317336 | A1 | 10/2021 | Igami | |

FOREIGN PATENT DOCUMENTS

| | | | |
|---|---|---|---|
| JP | 2002167552 A | * | 6/2002 |
| JP | 2004-082613 | | 3/2004 |
| JP | 2007-261253 | | 10/2007 |
| JP | 2011-052170 | | 3/2011 |
| JP | 2013-147659 | | 8/2013 |
| JP | 2018-059062 | | 4/2018 |
| JP | 2018-176540 | | 11/2018 |
| JP | 2019-018449 | | 2/2019 |
| JP | 6746410 | | 8/2020 |
| KR | 10-2016-0055655 | | 5/2016 |
| KR | 10-2016-0058512 | | 5/2016 |
| WO | 2005/010077 | | 2/2005 |
| WO | 2009/066608 | | 5/2009 |
| WO | 2013/099909 | | 7/2013 |
| WO | 2019/066080 | | 4/2019 |
| WO | 2020/137588 | | 7/2020 |

OTHER PUBLICATIONS

Notice of Submission of Publications, etc. mailed on Oct. 7, 2025 issued with respect to the basic Japanese Patent Application No. 2021-124950.

International Search Report for PCT/JP2022/028346 mailed on Oct. 4, 2022.

Office Action mailed on Jul. 16, 2025 issued with respect to the corresponding Chinese patent application No. 202280047499.4.

* cited by examiner

LAMINATE, LAMINATE FOR OUTDOOR USE, AND HARD COAT LAYER-FORMING MATERIAL

TECHNICAL FIELD

The present invention relates to a laminate, a laminate for outdoor use, and a hard coat layer-forming material.

BACKGROUND ART

It is desired to reduce reflection on image display surfaces of image display devices (e.g., liquid crystal displays (LCD), electroluminescence displays (ELD), field emission displays (FED), electronic paper, tablet PC, plasma display panels (PDP), and cathode ray tube (CRT) display devices) or pointing devices (e.g., touch panels) caused by light beams emitted from external light sources to increase visibility. To this end, a laminate, in which a hard coat layer and an anti-reflection layer are formed on a light transmitting base, is generally used to reduce reflection on an image display surface to improve visibility.

However, the laminate loses adhesion at the interface between the hard coat layer, which is an organic layer, and the anti-reflection layer, which is an inorganic layer, as the laminate is exposed to ultraviolet rays when it is used outdoors, or the like. Therefore, peeling is likely to occur, and it is difficult to achieve excellent adhesion between the layers of the laminate.

When a laminate formed of a glass-like transparent hard coat layer and an anti-reflection layer is used at an image display surface, moreover, the outermost surface of the laminate is smooth, and there is a problem associated with the sliding ability of the surface of the hard coat layer, which may impair blocking resistance. Particularly in a vacuum environment during a drying process, blocking is very likely to occur.

To solve the above-described problems, for example, the following laminate having excellent adhesion between layers and excellent blocking resistance is proposed. The laminate includes a hard coat layer including silica particles and a silane coupling agent, and a dry film layer disposed on the hard coat layer (see, for example, PTL 1).

CITATION LIST

Patent Literature

PTL 1: Japanese Patent (JP-B) No. 6746410

SUMMARY OF INVENTION

Technical Problem

However, the laminate disclosed in the above-mentioned related art literature does not have satisfactory properties in terms of adhesion between layers and blocking resistance. Therefore, further improvements and developments of laminates are currently desired.

The present invention aims to solve the above-described various problems existing in the related art and to achieve the following object. Namely, an object of the present invention is to provide a laminate having excellent blocking resistance and significantly improved adhesion between a hard coat layer and a dry film layer formed on the hard coat layer.

Solution to Problem

Means for solving the above-described problems are as follows.

<1> A laminate, including:

a base;

a hard coat layer disposed on the base; and a dry film layer disposed on the hard coat layer, wherein the hard coat layer includes a polysilsesquioxane derivative, and an abundance ratio [(Si/C)×100] of silicon atoms Si to carbon atoms C existing at a surface of the hard coat layer facing the dry film layer is 30% or greater.

<2> The laminate according to <1>, wherein the abundance ratio [(Si/C)×100] is 40% or greater.

<3> The laminate according to <1> or <2>, wherein an amount of the polysilsesquioxane derivative is 0.5% by mass or greater.

<4> The laminate according to any one of <1> to <3>, wherein the hard coat layer further includes metal oxide particles and a binder resin.

<5> The laminate according to <4>, wherein the binder resin includes an active energy ray-curable resin.

<6> The laminate according to <4> or <5>, wherein the metal oxide particles are silica particles.

<7> The laminate according to any one of <1> to <6>, wherein an average thickness of the hard coat layer is 1 μm or greater.

<8> The laminate according to any one of <1> to <7>, wherein the dry film layer includes high refractive index layers and low refractive index layers that are alternately laminated.

<9> The laminate according to any one of <1> to <8>, wherein the laminate is in at least one of a roll form and a single plate form.

<10> A laminate for outdoor use, including:

a base;

a hard coat layer disposed on the base; and a dry film layer disposed on the hard coat layer, wherein the hard coat layer includes a polysilsesquioxane derivative, and an abundance ratio [(Si/C)×100] of silicon atoms Si to carbon atoms C existing at a surface of the hard coat layer facing the dry film layer is 30% or greater.

<11> A hard coat layer-forming material, including:

a polysilsesquioxane derivative;

silica particles; and an active energy ray-curable resin.

Effects of Invention

According to the present invention, the above-described various problems existing in the related art can be solved; the above-described object can be achieved; and a laminate having excellent blocking resistance and significantly improved adhesion between a hard coat layer and a dry film layer formed on the hard coat layer can be provided.

DESCRIPTION OF EMBODIMENTS (Laminate)

Figure 1:
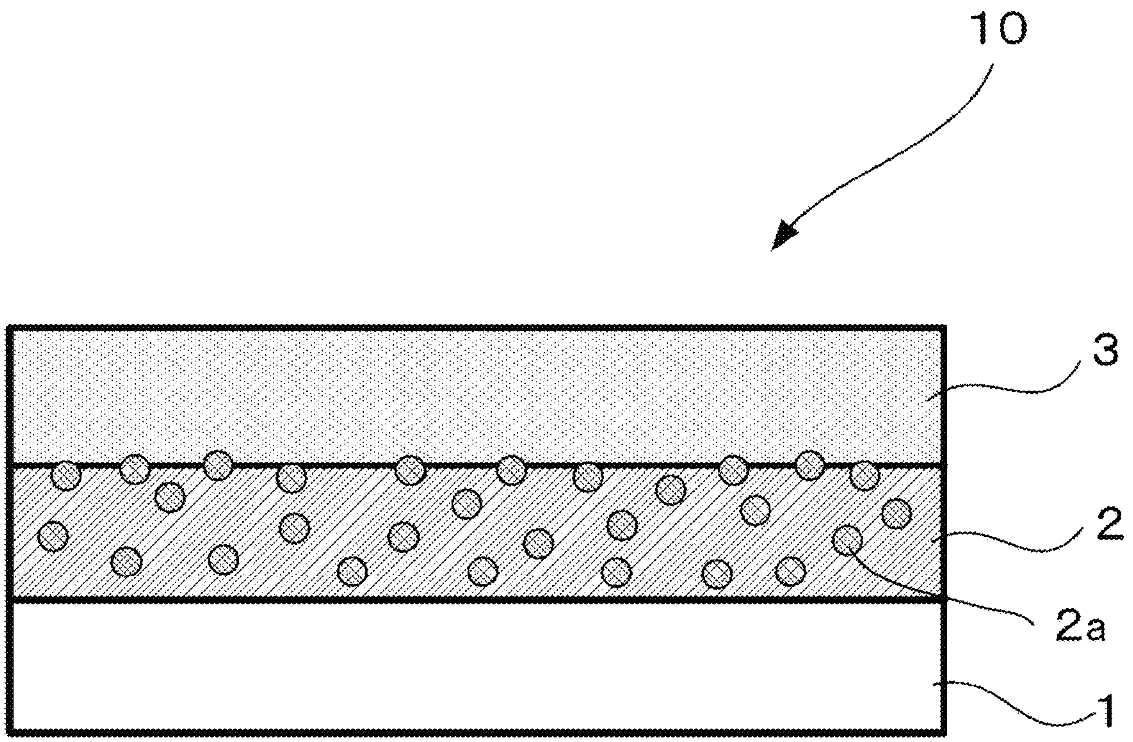
FIG. 1 is a schematic view illustrating an example of the laminate of the present invention.

The laminate of the present disclosure includes a base, a hard coat layer disposed on the base, and a dry film layer disposed on the hard coat layer. The hard coat layer includes a polysilsesquioxane derivative. An abundance ratio [(Si/C)×100] of silicon atoms Si to carbon atoms C existing at a surface of the hard coat layer facing the dry film layer is 30% or greater.

In the present invention, the abundance ratio [(Si/C)×100] of silicon atoms Si existing at the surface of the hard coat layer facing the dry film layer relative to carbon atoms C existing at the surface of the hard coat layer facing the dry film layer is 30% or greater, more preferably 40% or greater, and particularly preferably 45% or greater. The upper limit of the abundance ratio is not particularly limited, and may be appropriately selected according to the intended purpose. The upper limit of the abundance ratio is preferably 100% or less. When the abundance ratio [(Si/C)×100] is 30% or greater, a large amount of Si is present at the surface of the hard coat layer facing the dry film layer, thus adhesion between the hard coat layer and the dry film layer is significantly improved.

The abundance ratio [(Si/C)×100] can be measured by the following method (1) or (2).

(1) A dry film layer is removed from a laminate, which includes a base, a hard coat layer disposed on the base, and the dry film layer disposed on the hard coat layer, using a microfeather blade under a stereoscopic microscope to expose the hard coat layer, element ratios of C and Si at the surface of the hard coat layer are measured by X-ray photoelectron spectroscopy, and an abundance ratio [(Si/C)×100] is determined from an arithmetic means of 5 measurements.

(2) An intermediate laminate including a base and a hard coat layer disposed on the base is prepared, and element ratios of C and Si at the surface of the hard coat layer are measured by X-ray photoelectron spectroscopy, and an abundance ratio [(Si/C)×100] is determined from an arithmetic means of 5 measurements.

For example, the X-ray photoelectron spectroscopy is carried out by performing a measurement using PHI5000 VersaProbeII produced by ULVAC-PHI, Inc. under the following measuring conditions as ESCA (Electron Spectroscopy for Chemical Analysis). The angle during the measurement is set at 45 degrees.

[Measuring Conditions]

X-ray source: monochrome Al

X-ray gun: 50 W, 15 kV

Measured area: 200 μm in diameter

Since the hard coat layer includes a polysilsesquioxane derivative according to the present invention, adhesion between the hard coat layer and the dry film layer can be significantly improved. Since the polysilsesquioxane derivative, which is an organic-inorganic hybrid material, is distributed and present at a surface of the hard coat layer, specifically, the abundance ratio [(Si/C)×100] at the surface of the hard coat layer facing the dry film layer is 30% or greater, and therefore adhesion between the dry film layer, which is formed of an inorganic material, and the hard coat layer is significantly improved, which also improves blocking resistance.

For the abundance ratio [(Si/C)×100] at the surface of the hard coat layer facing the dry film layer, Si derived from the metal oxide particles (silica particles) and Si derived from the polysilsesquioxane derivative are both considered. A total amount of these Si atoms effectively contributes to adhesion between the layers.

<Base>

The size, form, material, and structure of the base are not particularly limited, and may be appropriately selected according to the intended purpose.

The form of the base is not particularly limited, and may be appropriately selected according to the intended purpose. Examples of the form of the base include sheet forms, film forms, and the like.

The size of the base is not particularly limited, and may be appropriately selected according to the intended use of the laminate.

Examples of the material of the base include polyester-based resins, triacetyl cellulose (TAC), acetate-based resins, polyether sulfone-based resins, polycarbonate-based resins, polyamide-based resins, polyimide-based resins, polyolefin-based resins, (meth)acrylic resins, polyvinyl chloride-based resins, polyvinylidene chloride-based resins, polystyrene-based resins, polyvinyl alcohol-based resins, polyacrylate-based resins, polyphenylene sulfide-based resins, and the like. Among the above-listed examples, triacetyl cellulose (TAC), acetate-based resins, polycarbonate-based resins, and polyolefin-based resins are preferred, and triacetyl cellulose (TAC) is particularly preferred.

When triacetyl cellulose (TAC) is used as a base, as a hard coat layer is formed on the base, part of constituent components of the hard coat layer penetrates into the base to form a penetration layer. The formed penetration layer contributes adhesion between the base and the hard coat layer, and can prevent formation of interference fringes due to a difference in refractive indexes between the base and the hard coat layer.

When the base is formed of a polyester-based resin (e.g., polyethylene terephthalate (PET) and polyethylene naphthalate (PEN)), moreover, the base preferably has in-plane birefringence, and retardation of the base is preferably 3,000 nm or greater. Since the above-described base is used, formation of interference fringes on the laminate of the present invention can be effectively minimized. When the base is formed of a polyester-based resin, a base of low optical retardation, i.e., less than 3,000 nm, may be used as the base.

An average thickness of the base is preferably 15 μm or greater and 200 μm or less, more preferably 40 μm or greater and 200 μm or less, and yet more preferably 40 μm or greater and 125 μm or less. When the average thickness is less than 15 μm, the base is likely to crease, which may make continuous formation of a hard coat layer on the base difficult in the production of the laminate of the present invention. Moreover, curling of the base may become noticeable, and low pencil hardness may be reduced. Moreover, creasing may be easily caused by heat generated when a dry film layer is laminated. When the average thickness is greater than 200 μm, the base may not be easily rolled into a roll in the production of the laminate of the present invention, or such a thickness may be disadvantageous in terms of reduction in thickness, weight, and cost of the laminate. Moreover, gas (e.g., moisture and organic matter)

is likely to be released from the base when a dry film layer is laminated, and the released gas may hinder formation of the dry film layer.

A surface of the base may be subjected to an etching process or undercoating process in advance. The etching process is a process, such as sputtering, corona discharging, UV irradiation, electron beam irradiation, chemical conversion, and oxidization. As the above-mentioned process is performed in advance, adhesion of the base with a hard coat layer formed on the base can be improved. Alternatively, the surface of the base may be optionally subjected to solvent cleaning, ultrasonic cleaning, or the like to remove dust and cleanse, before forming a hard coat layer.

<Hard Coat Layer>

The hard coat layer includes a polysilsesquioxane derivative. The hard coat layer preferably further includes metal oxide particles and a binder resin, and may further include other components, as necessary.

The hard coat layer may be a single layer or multiple layers.

—Polysilsesquioxane Derivative—

The polysilsesquioxane encompasses polysiloxane includes ($RSiO_{1.5}$) units where a skeleton of the principle chain of the polysiloxane is composed of Si—O bonds.

The polysilsesquioxane derivative is a compound including the polysiloxane and one, or two or more units represented by ($RSiO_{1.5}$) (T unit).

The polysilsesquioxane derivative may be in various forms. For example, the polysilsesquioxane derivative may have a basket structure, a ladder structure, a random structure, a partial cage structure, a cage structure, or the like.

The polysilsesquioxane derivative is an organic-inorganic hybrid material where an organic unit and inorganic unit form a composite at a molecular level.

For example, the polysilsesquioxane derivative can be represented by the following formula (1) including the following structural units (1-1), (1-2), (1-3), (1-4), and (1-5). In the following formula (1), v, w, x, y, and z are mole numbers of Structural units (1-1) to (1-5), respectively. In the following formula (1), v, w, x, y, and z are each an average value of the mole number of each structural unit contained in one molecule of the silsesquioxane derivative.

In the following formula (1), only one, or two or more of each of the structural units (1-2) to (1-5) may be used. Moreover, the actual condensed forms of the structural units of the polysilsesquioxane derivative is not limited to the order of the arrangement presented in the following formula (1), and is not particularly limited.

[Chem. 1]

(1)

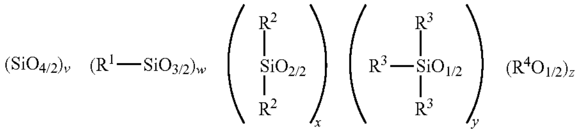

[Chem. 2]

Structural Unit (1-1)

$(SiO_{4/2})_v$

Structural Unit (1-2)

$(R^1—SiO_{3/2})_w$

-continued

Structural Unit (1-3)

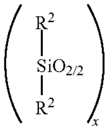

Structural Unit (1-4)

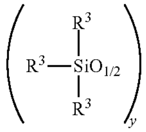

Structural Unit (1-5)

$(R^4O_{1/2})_z$

The polysilsesquioxane derivative may be formed by combining structural units in a manner that the structural unit selected from the four structural units of the above formula (1), namely, the structural unit (1-1), structural unit (1-2), structural unit (1-3), and the structural unit (1-4), includes at least one polymerizable functional group.

The polysilsesquioxane derivative may include the structural unit (1-2) and the structural unit (1-3). For example, w is a positive number in the above formula (1). For example, w and x are positive numbers, and v, y, and z are 0 or positive numbers in the above formula (1). Moreover, the silsesquioxane derivative may be composed of only the structural unit (1-2) (w is a positive number and the rest are 0).

The polysilsesquioxane derivative may include one, or two or more selected from the group consisting of the structural unit (1-1), the structural unit (1-3), and the structural unit (1-4). Specifically, one or two or more of v, x, and y in the above formula (1) may be positive numbers.

<Structural unit (1-1): Q Unit>

The structural unit defines a Q unit that is a basic structural unit of polysiloxane as represented in the above formula (1). The number of the structural units in the polysilsesquioxane derivative is not particularly limited.

<Structural Unit (1-2): T Unit>

The structural unit defines a T unit that is a basic structural unit of the polysiloxane. In the structural unit, $R^1$ may be at least one selected from the group consisting of a hydrogen atom, a C1-C10 alkyl group, a C1-C10 alkenyl group, a C1-C10 alkynyl group, an aryl group, an aralkyl group, and a polymerizable functional group.

$R^1$ may be a hydrogen atom. In case of the hydrogen atom, for example, if the structural unit and/or another structural unit includes a C2-C10 organic group having a carbon-carbon unsaturated bond capable of a hydrosilylation reaction (may be referred to as an "unsaturated organic group" hereinafter), a cross-linking reaction can be carried out between the structural units.

$R^1$ may be a C1-C10 alkyl group. The C1-C10 alkyl group may be an aliphatic group or an alicyclic group, and may be in the form of a straight chain or branched chain.

Specific examples of the alkyl group include C1-C6 straight-chain alkyl groups, such as methyl groups, ethyl groups, propyl groups, butyl groups, pentyl groups, hexyl groups, heptyl groups, octyl groups, nonyl groups, decyl groups, and the like. For example, moreover, the alkyl group is a C1-C4 straight-chain alkyl group, such as a methyl group, an ethyl group, a propyl group, a butyl group, and the like. For example, moreover, the alkyl group is a methyl group.

$R^1$ may be a C1-C10 alkenyl group. The C1-C10 alkenyl group may be an aliphatic group, an alicyclic group, or an aromatic group, and may be in the form of a straight chain or branched chain. Specific example of the alkenyl group include ethenyl (vinyl) groups, ortho-styryl groups, meta-styryl groups, para-styryl groups, 1-propenyl groups, 2-propenyl (allyl) groups, 1-butenyl groups, 1-pentenyl groups, 3-methyl-1-butenyl groups, phenylethenyl groups, allyl(2-propenyl) groups, octenyl(7-octen-1-yl) groups, and the like.

$R^1$ may be a C1-C10 alkynyl group. The C1-C10 alkynyl group may be an aliphatic group, an alicyclic group, or an aromatic group, and may be in the form of a straight chain or branched chain.

Specific examples of the alkynyl group include ethynyl groups, 1-propynyl groups, 1-butynyl groups, 1-pentynyl groups, 3-methyl-1-butynyl groups, phenylbutynyl groups, and the like.

$R^1$ may be an aryl group. For example, the number of carbon atoms contained in the aryl group is preferably 6 or greater and 20 or less, more preferably 6 or greater and 10 or less. Examples of the aryl group include phenyl groups, 1-naphthyl groups, 2-naphthyl groups, and the like.

$R^1$ may be an aralkyl group. For example, the number of carbon atoms contained in the aralkyl group is preferably 7 or greater and 20 or less, more preferably 7 or greater and 10 or less. Examples of the aralkyl group include phenylalkyl groups, such as a benzyl group.

$R^1$ is preferably a polymerizable functional group. The polymerizable functional group preferably includes at least a (meth)acryloyl group, namely, one of or both a methacryloyl group and an acryloyl group. The methacryloyloxy group includes a whole part of a methacryloxy group, and a methacryloyloxy group is classified as a methacryloyl group. In the similar manner, an acryloyloxy group includes a whole part of an acryloyl group, and an acryloyloxy group is classified as acryloyl group.

Moreover, a polymerizable polysilsesquioxane derivative may include a polymerizable functional group other than the (meth)acryloyl group. Examples of the polymerizable functional group other than the (meth)acryloyl group include heat-curable or photocurable polymerizable functional groups. The above-mentioned other polymerizable functional groups are not particularly limited, and may be appropriately selected according to the intended purpose. Examples of the above-mentioned other polymerizable functional groups include functional groups each including a vinyl group, an allyl group, a styryl group, an α-methylstyryl group, a vinyl ether group, a vinyl ester group, an acrylamide group, a methacrylamide group, a N-vinylamide group, a maleic acid ester group, a fumaric acid ester group, a N-substituted maleimide group, an isocyanate group, an oxetanyl group, an epoxy group, or a thiol group.

For example, the polymerizable functional group including a (meth)acryloyl group is preferably a group represented by the following formula or a group including the group represented by the following formula.

[Chem. 3]

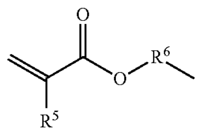

In the above formula, $R^5$ is a hydrogen atom or a methyl group, and $R^6$ is a C1-C10 alkylene group. $R^6$ is preferably a C2-C10 alkylene group.

The oxetanyl group is not particularly limited, and may be appropriately selected according to the intended purpose. Examples of the oxetanyl group include a (3-ethyl-3-oxetanyl)methyloxy group, a (3-ethyl-3-oxetanyl)oxy group, and the like.

The group including the oxetanyl group is preferably a group represented by the following formula or a group containing the group represented by the following formula.

[Chem. 4]

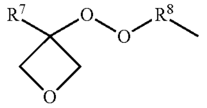

In the formula above, $R^7$ is a hydrogen atom or a C1-C6 alkyl group, and $R^8$ is a C1-C6 alkylene group. $R^7$ is preferably a hydrogen atom, a methyl group, or an ethyl group, more preferably an ethyl group. $R^3$ is preferably a C2-C6 alkylene group, more preferably a propylene group.

The epoxy group is not particularly limited, and may be appropriately selected according to the intended purpose. Examples of the epoxy group include; C1-C10 alkyl groups each substituted with a glycidyloxy group (e.g., β-glycidyloxyethyl, γ-glycidyloxypropyl, and γ-glycidyloxybutyl); glycidyl groups; and C1-C10 alkyl groups each substituted with a C5-C8 cycloalkyl group having an oxysilane group (e.g., a β-(3,4-epoxycyclohexyl)ethyl group, a γ-(3,4-epoxycyclohexyl)propyl group, β-(3,4-epoxycycloheptyl)ethyl group, a 4-(3,4-epoxycyclohexyl)butyl group, and a 5-(3,4-epoxycyclohexyl)pentyl group).

The polymerizable functional group may be the above-described unsaturated organic group, i.e., a functional group having a carbon-carbon double bond or carbon-carbon triple bond that can cause a hydrosilylation reaction with a hydrogen atom bonded to a silicon atom (hydrosilyl group).

The unsaturated organic group can also function as a polymerizable functional group because, in the presence of a hydrogen atom of a hydroxylyl group, the unsaturated organic group is polymerized with the hydrogen atom through a hydrosilyl reaction to form a hydrosilylation structure unit. Specific examples of the unsaturated organic group include the above-mentioned alkenyl group, the above-mentioned alkynyl group, and the like. Examples of the unsaturated organic group include vinyl groups, ortho-styryl groups, meta-styryl groups, para-styryl groups, acryloyl groups, methacryloyl groups, acryloxy groups, methacryloxy groups, 1-propenyl groups, 1-butenyl groups, 1-pentenyl groups, 3-methyl-1-butenyl groups, phenylethenyl groups, ethynyl groups, 1-propynyl groups, 1-butynyl groups, 1-pentyl groups, 3-methyl-1-butynyl groups, phenylbutynyl groups, allyl(2-propenyl) groups, octenyl(7-octen-1-yl) groups, and the like. For example, the unsaturated organic group is a vinyl group, a para-styryl group, an allyl(2-propenyl) group, or an octenyl(7-octen-1-yl) group. Moreover, the unsaturated organic group is, for example, a vinyl group.

The polysilsesquioxane derivative may include two or more polymerizable functional groups. In such a case, all of the polymerizable functional groups may be the same or different from one another. Moreover, some polymerizable functional groups may be the same and a different polymerizable functional group may be further included.

Each of the polymerizable functional groups may be substituted. As the substituent, for example, each of the polymerizable functional groups may be substituted with at least one of halogen atoms (e.g., fluorine atoms, chlorine atoms, bromine atoms, and chlorine atoms, etc.), alkyl groups (e.g., methyl groups, ethyl groups, n-propyl groups, isopropyl groups, n-butyl groups, s-butyl groups, isobutyl groups, t-butyl groups, n-pentyl groups, n-hexyl groups, n-heptyl groups, n-octyl groups, and isooctyl groups, etc.), hydroxyl groups, alkoxy groups, aryloxy groups, aralkyloxy groups, oxy groups (=O), cyano groups, and protected hydroxyl groups.

A protecting group of the hydroxyl group that the protected hydroxyl group has is not particularly limited, and may be appropriately selected according to the intended purpose. Examples of the protecting group include: acyl-based protecting group represented by —C(=O)R (in the formula, R is a C1-C6 alkyl group, such as methyl groups, ethyl groups, n-propyl groups, isopropyl groups, n-butyl groups, isobutyl groups, s-butyl groups, t-butyl groups, and n-pentyl groups; or a phenyl group that has a substituent or does not have a substituent, where examples of the substituent in the phenyl group having a substituent include: alkyl groups, such as methyl groups, ethyl groups, n-propyl groups, isopropyl groups, n-butyl groups, s-butyl groups, isobutyl groups, t-butyl groups, n-pentyl groups, n-hexyl groups, n-heptyl groups, n-octyl groups, and isooctyl group; halogen atoms, such as fluorine atoms, chloride atoms, and bromine atoms; and alkoxy groups, such as methoxy groups and ethoxy groups); silyl-based protecting groups, such as trimethylsilyl groups, triethylsilyl groups, t-butyldimethylsilyl groups, and t-butyldiphenylsilyl groups; acetal-based protecting groups, such as methoxymethyl groups, methoxyethoxymethyl groups, 1-ethoxyethyl groups, tetrahydropyran-2-yl groups, and tetrahydrofuran-2-yl groups; alkoxycarbonyl-based protecting groups, such as t-butoxycarbonyl groups; ether-based protecting groups, such as methyl groups, ethyl groups, t-butyl groups, octyl groups, allyl groups, triphenylmethyl groups, benzyl groups, p-methoxybenzyl groups, fluorenyl groups, trityl groups, and benzhydryl groups; and the like.

The polysilsesquioxane derivative may include one kind, or two or more kinds of the structural unit in combination. For example, $R^1$ in one of the structural units is an alkyl group, and $R^1$ in another structural unit is a polymerizable functional group. For example, moreover, $R^1$ in one of the structural units is a hydrogen atom, and $R^1$ in another structural unit is an unsaturated organic group serving as the polymerizable functional group.

The ratio of the numbers of moles of the structural unit in the polysilsesquioxane derivative, which is represented by w, is a positive number. The w is not particularly limited, and may be appropriately selected according to the intended purpose. For example, w/(v+w+x+y) is preferably 0.25 or greater, more preferably 0.3 or greater, yet more preferably 0.35 or greater, particularly preferably 0.4 or greater, yet further preferably 0.5 or greater, yet particularly preferably 0.6 or greater, the most preferably 0.7 or greater, yet the most preferably 0.8 or greater, and further the most preferably 1.

<Structural unit (1-3): D Unit>

The structural unit defines a D-unit as a basic structural unit of the polysilsesquioxane derivative. $R^2$ of the structural unit is at least one selected from the group consisting of a hydrogen atom, a C1-C10 alkyl group, a C1-C10 alkenyl group, a C1-C10 alkynyl group, an aryl group, an aralkyl group, and a polymerizable functional group. The two $R^2$ in the structural unit may be the same or different.

For the C1-C10 alkyl group, C1-C10 alkenyl group, C1-C10 alkynyl group, aryl group, aralkyl group, and polymerizable functional group, any of the various embodiments already mentioned may be applied as it is in the structural unit.

The polysilsesquioxane derivative may include one kind, or two or more kinds of the structural unit in combination. The silsesquioxane derivative includes, for example, the structural units, in at least part of which the two $R^2$ are both C1-C10 alkyl groups. For example, moreover, the two $R^2$ are both C1-C10 alkyl groups in all of the structural units.

The ratio of the number of moles of the structural unit in the polysilsesquioxane derivative, which is represented by x, is 0 or a positive number. The x is not particularly limited, and may be appropriately selected according to the intended purpose. For example, x/(v+w+x+y) is preferably 0.25 or greater, more preferably 0.3 or greater, yet more preferably 0.35 or greater, and particularly preferably 0.4 or greater. Moreover, the upper limit is preferably 0.5 or less, more preferably 0.45 or less.

<Structural Unit (1-4): M Unit>

The structural unit defines an M unit as a basic structural unit of the polysilsesquioxane derivative. $R^3$ of the structural unit is at least one selected from the group consisting of a hydrogen atom, a C1-C10 alkyl group, a C1-C10 alkenyl group, a C1-C10 alkynyl group, an aryl group, an aralkyl group, and a polymerizable functional group. $R^3$ of the structural unit may be at least one selected from the group consisting of a hydrogen atom, a polymerizable functional group, and a C1-C10 alkyl group. The three $R^3$ may be the same or different from one another.

For the C1-C10 alkyl group, C1-C10 alkenyl group, C1-C10 alkynyl group, aryl group, aralkyl group, and polymerizable functional group, any of the various embodiments already mentioned may be applied as it is in the structural unit.

The polysilsesquioxane derivative may include one kind, or two or more kinds of the structural unit in combination. The silsesquioxane derivative includes, for example, the structural units, in at least part of which the two $R^3$ are both C1-C10 alkyl groups. For example, moreover, the two $R^3$ are both C1-C10 alkyl groups in all of the structural units.

The ratio of the number of moles of the structural unit in the polysilsesquioxane derivative, which is represented by y, is 0 or a positive number. The y is not particularly limited, and may be appropriately selected according to the intended purpose. For example, y/(v+w+x+y) is preferably 0.25 or greater, more preferably 0.3 or greater, yet more preferably 0.35 or greater, and particularly preferably 0.4 or greater. Moreover, the upper limit is preferably 0.5 or less, more preferably 0.45 or less.

<Structural Unit (1-5)>

The structural unit defines a unit including an alkoxy group or hydroxyl group in the polysilsesquioxane derivative. Specifically, $R^4$ in the structural unit is a hydrogen atom or a C1-C10 alkyl group. The alkyl group may be an aliphatic group or an alicyclic group, and may be in the form of a straight chain or a branched chain. Specific examples of the alkyl group include methyl groups, ethyl groups, n-propyl groups, isopropyl groups, butyl groups, pentyl groups, hexyl groups, and the like. For example, the alkyl group is typically a C2-C10 alkyl group, such as a methyl group, an ethyl group, an n-propyl group, an isopropyl group, and the like. For example, moreover, the alkyl group is a C1-C6 alkyl group.

The alkoxy group in the structural unit is an "alkoxy group" that is a hydrolysable group included in a starting material monomer, or an "alkoxy group" generated by substituting an alcohol included in a reaction solvent with a hydrolysable group of a starting material monomer, which remains within a molecule without causing hydrolysis or polycondensation. Moreover, the hydroxyl group in the structural unit is a hydroxyl group remaining within a molecule without causing polycondensation, after hydrolysis of the "alkoxy group", or the like.

The ratio of the number of moles of the structural unit in the polysilsesquioxane derivative, which is represented by z, is 0 or a positive number.

A number average molecular weight of the polysilsesquioxane derivative is preferably from 300 to 10,000. The polysilsesquioxane derivative itself has low viscosity, and is easily dissolved in an organic solvent, where a resulting solution has a viscosity that is easily handled, and has excellent storage stability. In view of coating ability, storage stability, thermal resistance, and the like, the number average molecular weight is preferably 300 to 8,000, more preferably from 300 to 6,000, yet more preferably from 300 to 3,000, particularly preferably from 300 to 2,000, and the most preferably from 500 to 2,000. For example, the number average molecular weight can be measured by gel permeation chromatography (GPC) using polystyrene as a standard substance.

The polysilsesquioxane derivative is preferably in the form of a liquid. In the case where the polysilsesquioxane derivative is a liquid, for example, the viscosity of the polysilsesquioxane derivative at 25° C. is preferably 500 mPa·s or greater, more preferably 1,000 mPa·s or greater, and yet more preferably 2,000 mPa·s or greater.

The polysilsesquioxane derivative may be appropriately synthesized for use, or a commercial product of the polysilsesquioxane derivative may be used.

The polysilsesquioxane derivative is not particularly limited, and can be produced according to any methods available in the related art. For example, a production method of the polysilsesquioxane derivative is specifically disclosed as a production method of polysiloxane in WO 2005/010077, WO 2009/066608, WO 2013/099909, JP-A No. 2011-052170, JP-A No. 2013-147659, and the like.

Examples of the commercial product of the polysilsesquioxane derivative include AC-SQ series, MAC-SQ series, and OX-SQ series, all of which are produced by TOAGOSEI CO., LTD., and the like.

Examples of the commercial product of the polysilsesquioxane derivative include COMPOCERAN SQ500 (epoxy group-containing silsesquioxane compound) and COMPOCERAN SQ100 (thiol-group containing silsesquioxane compound), both of which are produced by ARAKAWA CHEMICAL INDUSTRIES, LTD., and the like.

The amount of the polysilsesquioxane derivative is preferably 0.5% by mass or greater, more preferably 1% by mass or greater, yet more preferably 3% by mass or greater, and particularly preferably 5% by mass or greater, relative to a total amount of the hard coat layer. The upper limit of the amount of the polysilsesquioxane derivative is not particularly limited, and may be appropriately selected according to the intended purpose. The upper limit is preferably 20% by mass or less, more preferably 15% by mass or less.

When the amount of the polysilsesquioxane derivative is 0.5% by mass or greater, adhesion between the hard coat layer and the dry film layer is improved.

—Metal Oxide Particles—

Examples of the metal oxide particles include $SiO_2$ (silica) particles, $Al_2O_3$ (alumina) particles, $TiO_2$ (titania) particles, $ZrO_2$ (zirconia) particles, $CeO_2$ (ceria) particles, MgO (magnesia) particles, ZnO particles, $Ta_2O_5$ particles, $Sb_2O_3$ particles, $SnO_2$ particles, $MnO_2$ particles, and the like. The above-listed examples may be used alone or in combination. The metal oxide particles can be produced by a sol-gel method or the like. Among the above-listed examples, silica particles are particularly preferred because high transparency can be assured, and a refractive index of the hard coat layer is easily adjusted.

For the purpose of enhancing adhesion and affinity to a resin, functional groups (e.g., acrylic groups, methacrylic groups, alkyl groups, epoxy groups, etc.) may be introduced to surfaces of the metal oxide particles.

A commercial product may be used as the silica particles. Examples of the commercial product include the product name "IPA-ST-L" and the product name "MIBK-ST-L" (both produced by Nissan Chemical Corporation), and the like.

The metal oxide particles are preferably dispersed in the hard coat layer in the state of single particles.

An average particle diameter of the metal oxide particles is preferably 7 nm or greater and 100 nm or less, more preferably 10 nm or greater and 60 nm or less.

The average particle diameter can be measured, for example, by a dynamic light scattering particle size analyzer.

When the average particle diameter is less than 7 nm, it may be difficult to disperse the metal oxide particles in the state of single particles. When the average particle diameter is greater than 100 nm, adhesion between the hard coat layer and the dry film layer may be reduced.

An amount of the metal oxide particles relative to a total amount of the hard coat layer is preferably 80% by mass or less, more preferably 20% by mass or greater and 60% by mass or less.

The metal oxide particles are not particularly limited, and may be appropriately selected according to the intended purpose. In view of the adhesion between the layers, the metal oxide particles are exposed from the surface of the hard coat layer facing the dry film layer. According to the above-described structure, the dry film layer strongly adheres to the binder resin of the hard coat layer, and the dry film layer more strongly adheres to the exposed metal oxide particles to improve adhesion between the hard coat layer and dry film layer, so that abrasion resistance of the laminate of the present invention can be improved.

The metal oxide particles being exposed from the surface of the hard coat layer facing the dry film layer represent a state of the metal oxide particles where part of the metal oxide particles are projected from the surface of the hard coat layer and a binder resin constituting the hard coat layer is not present on the projected parts of the metal oxide particles. The state of the exposed metal oxide particles can be confirmed, for example, by observing a cross-section under a microscope.

A method of exposing the metal oxide particles is not particularly limited, except that the method can selectively etch the binder resin of the hard coat layer. For example, glow discharge, plasma processing, ion etching, alkaline etching, or the like can be used.

—Binder Resin—

The binder resin is preferably a transparent resin. For example, the binder resin is more preferably an active energy ray-curable resin that is cured by irradiation with active energy rays.

In the present specification, the "resin" is a term encompassing monomers, oligomers, polymers, etc., unless otherwise stated.

Examples of the active energy ray-curable resin include a compound including one, or two or more unsaturated bonds (e.g., a compound including a functional group(s), such as acrylate-based functional groups), and the like.

Examples of a compound including one unsaturated bond include ethyl (meth)acrylate, ethylhexyl (meth)acrylate, styrene, methyl styrene, N-vinylpyrrolidone, and the like. The above-listed examples may be used alone or in combination.

Examples of a compound including two or more unsaturated bonds include polyfunctional compounds, such as trimethylolpropane tri(meth)acrylate, tripropylene glycol di(meth)acrylate, diethylene glycol di(meth)acrylate, dipropylene glycol di(meth)acrylate, pentaerythritol tri(meth) acrylate, pentaerythritol tetra(meth)acrylate, dipentaerythritol hexa(meth)acrylate, 1,6-hexanediol di(meth)acrylate, neopentyl glycol di(meth)acrylate, trimethylolpropane tri (meth)acrylate, ditrimethylolpropane tetra(meth)acrylate, dipentaerythritol penta(meth)acrylate, tripentaerythritol octa (meth)acrylate, tetrapentaerythritol deca(meth)acrylate, isocyanuric acid tri(meth)acrylate, isocyanuric acid di(meth) acrylate, polyester tri(meth)acrylate, polyester di(meth) acrylate, bisphenol di(meth)acrylate, diglycerin tetra(meth) acrylate, adamantyl di(meth)acrylate, isobornyl di(meth) acrylate, dicyclopentane di(meth)acrylate, tricyclodecane di(meth)acrylate, ditrimethylolpropane tetra(meth)acrylate, and the like. The above-listed examples may be used alone or in combination. Among the above-listed examples, pentaerythritol triacrylate (PETA), dipentaerythritol hexaacrylate (DPHA), and pentaerythritol tetraacrylate (PETTA) are preferred.

In the present specification, "(meth)acrylate" encompasses methacrylate and acrylate. Moreover, the above-listed compounds that are modified with propylene oxide (PO), ethylene oxide (EO), caprolactone (CL), or the like may be used as the active energy ray-curable resin.

The active energy ray-curable resin may be used in combination with a solvent-drying resin (a resin formed into a coating film by merely drying a solvent added to adjust a solid content during coating, such as a thermoplastic resin).

The solvent-drying resin used in combination with the active energy ray-curable resin is not particularly limited. Typically, a thermoplastic resin can be used as the solvent-drying resin.

The thermoplastic resin is not particularly limited. Examples of the thermoplastic resin include styrene-based resins, (meth)acrylic resins, vinyl acetate-based resins, vinyl ether-based resins, halogen-containing resins, alicyclic olefin-based resins, polycarbonate-based resins, polyester-based resins, polyamide-based resins, cellulose derivatives, silicone resins, rubber or elastomers, and the like. The thermoplastic resin is preferably amorphous and soluble in an organic solvent (a common solvent used for dissolving a plurality of polymers or curable compounds). The thermoplastic resin is particularly preferably a styrene-based resin, a (meth)acrylic resin, an alicyclic olefin-based resin, a polyester-based resin, or a cellulose derivative (e.g., cellulose esters) in view of transparency and weather resistance.

The hard coat layer may include a thermoset resin.

The thermoset resin is not particularly limited, and may be appropriately selected according to the intended purpose. Examples of the thermoset resin include phenol resins, urea resins, diallyl phthalate resins, melamine resins, guanamine resins, unsaturated polyester resins, polyurethane resins, epoxy resins, amino-alkyd resins, melamine-urea co-condensation resins, silicon-based resins, polysiloxane resins, and the like.

The hard coat layer may include an organic-inorganic hybrid resin.

The organic-inorganic hybrid resin is a resin where an organic component and an inorganic component form a composite at a nano-level.

The organic-inorganic hybrid resin may be a resin where an organic component and an inorganic component are reacted to form a composite before curing, or a resin where an inorganic component reacts with an organic component as active rays are applied.

The size of the inorganic component in the organic-inorganic hybrid resin is 800 nm or less at which geometric scattering of light does not occur. In the case where particles are used as the inorganic component, particles having an average particle diameter of 800 nm or less are used.

Examples of the inorganic component include metal oxides, such as silica, titania, and the like. The inorganic component is preferably silica.

An amount of the inorganic component in the organic-inorganic hybrid resin is preferably 10% by mass or greater, more preferably 20% by mass or greater. Moreover, the amount of the inorganic component is preferably 65% by mass or less, more preferably 40% by mass or less.

Examples of the organic component in the organic-inorganic hybrid resin include compounds each having a polymerizable unsaturated group polymerizable with the inorganic component (preferably reactive silica) (e.g., a polyvalent unsaturated organic compound having two or more polymerizable unsaturated groups per molecule, a monovalent unsaturated organic compound having one polymerizable unsaturated group per molecule, etc.).

The organic-inorganic hybrid resin may be appropriately synthesized for use, or a commercial product may be used. Examples of the commercial product include SiliXan M100, M140, M150, and M200, produced by Kusumoto Chemicals, Ltd., and the like.

—Photopolymerization Initiator—

The hard coat layer preferably further includes a photopolymerization initiator.

The photopolymerization initiator is not particularly limited, and any of the photopolymerization initiators available in the related art may be used. Examples of the photopolymerization initiator include acetophenones, benzophenones, Michler's benzoylbenzoate, α-amidoxime esters, thioxanthones, propiophenones, benzyls, benzoins, acylphosphine oxides, and the like. Moreover, a photosensitizer is preferably used by mixing with the photopolymerization initiator. Specific examples of the photosensitizer include n-butylamine, triethylamine, poly-n-butylphosphine, and the like. Among the above-listed examples, a photopolymerization initiator, which is unlikely to evaporate or sublimate by heat applied when a dry film layer is laminated, is preferably used.

As the photopolymerization initiator, moreover, a compound having two or more cleavage points within a molecule is also suitably used. Example of the compound include 2-hydroxyl-{4-[4-(2hydroxy2-methyl-propionyl)-benzyl]phenyl}-2-methyl-propan-1-one (IRGACURE 127), oligo{2-hydroxy-2-methyl-1-[4-(1-methylvinyl)phenyl] propanone} (ESACURE ONE), and the like.

When the binder resin is a resin including a radical polymerizable unsaturated group, one of or a mixture of acetophenones, benzophenones, thioxanthones, benzoins, benzoin methyl ethers and the like is preferably used as the photopolymerization initiator. When the binder resin is a resin including a cationic polymerizable functional group, moreover, one of or a mixture of aromatic diazonium salts, aromatic sulfonium salts, aromatic iodonium salts, metallocene compounds, benzoin sulfonate, and the like is preferably used as the photopolymerization initiator.

An amount of the photopolymerization initiator is preferably from 0.5 parts by mass to 10.0 parts by mass, relative to 100 parts by mass of the binder resin. When the amount of the photopolymerization initiator is less than 0.5 parts by mass, hard coating properties of the formed hard coat layer may be insufficient. When the amount of the photopolymerization initiator is greater than 10.0 parts by mass, conversely, the photopolymerization initiator may hinder curing so that pencil hardness of the formed hard coat layer may be reduced. When a dry film is laminated, moreover, an unreacted component of the photopolymerization initiator or a component derived from reaction residues may evaporate or sublimate to hinder formation of a dry film layer so that desired mechanical properties and optical properties are not achieved. Moreover, a component derived from the evaporated or sublimated photopolymerization initiator may be deposited on a resulting laminate to cause a defect, which may impair quality of the laminate.

—Other Components—

Examples of optionally used other components include organic solvents, dispersing agents, surfactants, antistatic agents, ultraviolet absorbers, thickeners, anti-coloring agents, colorants (pigments and dyes), defoaming agents, leveling agents, flame retardants, adhesion imparting agents, polymerization inhibitors, antioxidants, surface modifiers, and the like.

Examples of the organic solvent include: alcohols (e.g., methanol, ethanol, propanol, isopropanol, n-butanol, s-butanol, t-butanol, benzyl alcohol, PGME, ethylene glycol, etc.); ketones (e.g., acetone, methyl ethyl ketone, methyl isobutyl ketone, cyclohexanone, etc.); ethers (e.g., dioxane, tetrahydrofuran, etc.); aliphatic hydrocarbons (e.g., hexane, etc.); alicyclic hydrocarbons (e.g., cyclohexane, etc.); aromatic hydrocarbons (e.g., toluene, xylene, etc.); halogenated carbons (e.g., dichloromethane, dichloroethane, etc.); esters (e.g., methyl acetate, ethyl acetate, butyl acetate, etc.); cellosolves (e.g., methyl cellosolve, ethyl cellosolve, etc.); cellosolve acetates, sulfoxides (e.g., dimethyl sulfoxide, etc.); amides (e.g., dimethylformamide, dimethylacetoamide, etc.); and the like. The above-listed examples may be used alone or in combination.

For example, the hard coat layer can be formed by applying a hard coat layer forming composition onto a base, drying the composition to form a coating film, and irradiating the coating film with active energy rays, etc. to cure the coating film. The hard coat layer forming composition includes the above-described polysilsesquioxane derivative, metal oxide particles, a binder resin, and appropriately selected other components.

A method of applying the hard coat layer forming composition onto a base is not particularly limited. Examples of the method include methods available in the related art as wet processing, such as spin coating, dip coating, spray coating, die coating, bar coating, roll coating, a meniscus coater method, flexographic printing, screen printing, a bead coater method, and the like.

After coating the hard coat layer forming composition in any of the above-listed methods, the formed coating film is transported to a heated zone to dry the coating film by any of various methods available in the related art to evaporate the solvent. The relative solvent evaporation speed, solid content, coating liquid temperature, drying temperature, drying air speed, drying time, and solvent atmosphere concentration of the drying zone, and the like are selected to adjust a dispersion state of the metal oxide particles.

Particularly, a method of adjusting a dispersion state of the metal oxide particles with adjustment of drying conditions is preferred because of simplicity. Specifically, a drying process in which a drying temperature is adjusted within the range of 50° C. to 100° C. for 30 seconds to 2 minutes is performed one, or two or more times so that the dispersion state of the metal oxide particles can be adjusted to the desired state.

Moreover, examples of a method of irradiating with ionizing radiation rays when the coating film after the drying is cured include methods using light sources, such as ultra-high-pressure mercury lamps, high-pressure mercury lamps, low-pressure mercury lamps, carbon arc lamps, black light fluorescent lamps, and metal halide lamps.

As wavelengths of ultraviolet rays, moreover, a wavelength range of 190 nm to 380 nm can be used. Specific examples of an electron beam source include various electron beam accelerators, such as Cockcroft-Walton type accelerators, Van de Graaft type accelerators, resonant transformer-type accelerators, insulated core transformer-type accelerators, linear accelerators, dynamitron-type accelerators, and high frequency-type accelerators.

During the irradiation with ionizing radiation rays, ionizing radiation rays may be applied in an inert gas atmosphere, such as nitrogen, to minimize inhibition of a radical polymerization reaction with oxygen.

An average thickness of the hard coat layer is preferably 1 μm or greater, more preferably 1 μm or greater and 20 μm or less, yet more preferably 2 μm or greater and 15 μm or less, and particularly preferably 4 μm or greater and 10 μm or less.

The average thickness of the hard coat layer can be measured, for example, by observing a cross-section under a microscope.

When the average thickness of the hard coat layer is less than 1 μm, precipitation of a low-molecular component, such as oligomers, from the base cannot be sufficiently minimized, or the hard coat layer may be easily scratched, and the active energy ray-curable resin does not sufficiently penetrate into the base so that the adhesion between the base and the hard coat layer may be insufficient. Moreover, visibility may be impaired due to noticeable interference fringes. When the average thickness of the hard coat layer is greater than 20 μm, the hard coat layer cannot be formed as a thin layer, and moreover, the formed hard coat layer tends to be cracked, curled, or creased. When a dry film layer is laminated, moreover, a low molecular weight organic component or water is released from the hard coat layer to hinder lamination of the dry film layer, impairing adhesion between the hard coat layer and the dry film layer. If the hard coat layer is curled, moreover, a dry film layer may also be cracked after laminating the dry film layer on the hard coat layer.

A refractive index of the hard coat layer is preferably from 1.45 to 1.60. When the refractive index of the hard coat layer is outside the above-mentioned range, a difference in the refractive index between the hard coat layer and the base becomes significant, which may cause formation of interference fringes.

<Dry Film Layer>

The laminate of the present invention includes a dry film layer disposed on a surface of the hard coat layer opposite to the side where the base is disposed.

The dry film layer is a layer that functions as an anti-reflection layer (AR layer). As the dry film layer, a layer, in which two or more refractive index layers having mutually different refractive indexes are laminated, may be used.

The dry film layer is directly laminated on the surface of the hard coat layer. According to the above-described structure, excellent adhesion between the hard coat layer and the dry film layer is achieved.

The dry film layer may be composed of an adhesion layer, an anti-reflection layer (AR layer), and an anti-fouling layer.

The adhesion layer is formed on the surface of the hard coat layer, and is formed of an oxygen deficient metal oxide or a metal, where the metal oxide is the same type of the metal oxide as the metal oxide particles.

The degree of oxidation of the adhesion layer is appropriately set according to an anti-reflection layer formed on the adhesion layer. The average thickness of the adhesion layer is preferably 10 nm or less.

As a method for forming each refractive index layer, various dry processes, such as sputtering, vapor deposition, and ion plating, have been studied, and a sufficient anti-reflection performance can be achieved by forming the refractive index layer according to any of the above-mentioned methods. When the laminate of the present invention is applied for an image display device, an outermost surface of the laminate, especially the outermost surface of a tough panel, is desired to have mechanical properties, durability, and resistance to the environment. Therefore, the method is preferably sputtering. To further improve the productivity, the most preferred method is roll coating, where a refractive index layer is formed while winding up the hard coat layer into a roll in a vacuum tank.

Among the refractive index layers constituting the dry film layer, a refractive index layer having a relatively high refractive index (may be referred to as a "high refractive index layer" hereinafter) preferably has a refractive index of 2.2 to 2.4. A material of the high refractive index layer is preferably a light transmitting material having a relatively high refractive index. As the light transmitting material, for example, SiN, $TiO_2$, $Nb_2O_5$, $Ta_2O_5$, ITO, or an alloy oxide including any of the foregoing materials as a main component is typically used. Specifically, examples of the material include alloy oxides each including any of the above-mentioned SiN, $TiO_2$, $Nb_2O_5$, $Ta_2O_5$, and ITO as a main component, to which a metal, such as Si, Sn, Zr, and Al, is added, provided that properties of the main component are not adversely affected.

The material is preferably $Nb_2O_5$ or SiN because a raw material of the above-mentioned $Ta_2O_5$ is expensive, and $TiO_2$ is likely to have absorption at a short-wavelength region so that productivity is low and unevenness in the production may be caused, especially when a dry film layer is formed by sputtering.

A refractive index layer having a relatively low refractive index (may be referred to as a "low refractive index layer" hereinafter) preferably has a refractive index of 1.43 to 1.53. For example, $MgF_2$, $SiO_2$, etc., or a material, in which a small amount of additives is added to any of the foregoing materials, may be used. When sputtering is used for formation of the low refractive index layer, $SiO_2$ is the most preferred.

Before forming an anti-reflection layer on the hard coat layer or on the adhesion layer, a surface of the hard coat layer or the adhesion layer may be modified by performing plasma processing inside a vacuum tank to improve adhesion of the hard coat layer or adhesion layer with the anti-reflection layer. After the plasma processing, moreover, an adhesion layer is preferably deposited.

As the adhesion layer, a metal oxide or metal nitride, such as $CrO_x$ (x=1 to 2), $SiN_x$, etc., may be used. Particularly preferred is a reductive Si oxide of $SiO_x$ (x=1 to 2) formed by sputtering to deposit a thickness of about 3 nm or greater and about 10 nm or less. When the thickness of $SiO_x$ is less than 3 nm, adequate adhesion may not be achieved. When the thickness of $SiO_x$ is 10 nm or greater, a sufficient transmittance may not be achieved due to light absorption of the $SiO_x$ film.

An anti-fouling layer may be formed on a surface of the dry film layer opposite to the side where the hard coat layer is disposed. A material of the anti-fouling layer is, for example, a perfluoropolyether group-containing alkoxysilane compound, a fluorocompound, or the like.

For example, the anti-fouling layer can be formed by forming an about 3 nm to about 5 nm-thick film of any of anti-fouling agents available in the related art by a wet process or a dry process. When the thickness of the anti-fouling layer is less than 3 nm, adequate anti-fouling properties cannot be achieved. When the thickness of the anti-fouling layer is greater than 5 nm, the anti-fouling layer may adversely affect optical properties of the laminate. The anti-fouling layer can impart anti-pollution properties and abrasion resistance. The anti-fouling layer is preferably formed by vapor deposition particularly in view of durability.

The dry film layer preferably has a structure where high refractive index layers and low refractive index layers are alternately laminated, where a total of layers laminated is four or more layers.

The dry film layer having the above-described structure has excellent adhesion to the hard coat layer as well as particularly excellent anti-reflection properties.

For the high refractive index layers and the low refractive index layers, specifically, preferred are an average thickness of 10 nm to 200 nm and a refractive index of 2.2 to 2.4, and each of the low refractive index layers preferably has an average thickness of 10 nm to 200 nm, and a refractive index of 1.43 to 1.53.

For the average thickness of the high refractive index layer and the average thickness of the low refractive index layer in the above-described structure where the high refractive index layers and the low refractive index layers are alternately laminated to have four or more laminated layers in total, the average thickness of the high refractive index layer is more preferably from 20 nm to 70 nm, and the average thickness of the low refractive index layer is more preferably from 20 nm to 120 nm.

In the laminate of the present invention, the refractive index of the high refractive index layer, the refractive index of the hard coat layer, and the refractive index of the low refractive index layer preferably satisfy the relationship represented by the following (1).

Refractive index of high refractive index layer>refractive index of hard coat layer>refractive index of low refractive index layer Formula (1)

The average thickness of the low refractive index layer and the average thickness of the high refractive index layer are determined by selecting two random points on a TEM/STEM cross-section photograph to measure thickness, repeating the same process 5 times on different images of the same sample, and calculating an arithmetic means of the thickness values measured at 10 points in total as an average thickness (nm).

The above-described measuring method is also used to measure a thickness of a film other than the low refractive index layer and the high refractive index layer, as long as the film is a thin film of nano-order.

Assuming that refractive indexes in a wavelength region of 380 nm to 780 nm are constant, the refractive index of the low refractive index layer and the refractive index of the high refractive index layer are each calculated by fitting a reflection spectrum measured by a spectrophotometer with a spectrum calculated from an optical model of a thin film using Fresnel equations.

The laminate of the present invention is preferably in at least one of a roll form and a single plate form. Among the above-listed example, the roll form is particularly preferred. Since the laminate of the present invention in the roll form has excellent blocking resistance, the laminate can be formed as a long sheet that is wound up as a roll. The roll of the long sheet formed of the laminate of the present invention is formed by using, as a base, a roll of a long sheet that is wound up, and forming both the hard coat layer and the dry film layer by roll-to-roll processing. In the formation of the above-described roll, a protective film including a weak adhesive layer may be bonded as a separator to a surface of the hard coat film for a touch panel, followed by winding the laminate up to a roll. However, the roll of the long sheet of the laminate of the present invention can be formed without a protective film or the like, as the laminate of the present invention has excellent blocking resistance.

FIG. 1 is a schematic view illustrating an example of the laminate of the present invention. The laminate 10 of FIG. 1 includes a hard coat layer 2 on a base 1, and a dry film layer 3 on the hard coat layer. Metal oxide particles 2*a* are homogeneously dispersed in the hard coat layer 2 so that part of the meal oxide particles 2*a* is exposed to the surface of the hard coat layer facing the dry film layer.

(Laminate for Outdoor Use)

The laminate for outdoor use of the present invention includes a base, a hard coat layer on the base, and a dry film layer on the hard coat layer. The hard coat layer includes a polysilsesquioxane derivative. An abundance ratio [(Si/C)×100] of silicon atoms Si to carbon atoms C existing at a surface of the hard coat layer facing the dry film layer is 30% or greater, preferably 40% or greater.

The laminate for outdoor use is particularly suitably used outdoors, in very severe environments, where the laminate is exposed to ultraviolet rays, etc., for a long period, and fluctuations in temperature, humidity, etc., are large.

(Hard Coat Layer-Forming Material)

The hard coat layer-forming material of the present invention includes a polysilsesquioxane derivative, silica particles, and an active energy ray-curable resin. The hard coat layer-forming material may further include other components, as necessary.

As the polysilsesquioxane derivative, the silica particles, the active energy ray-curable resin, and other components, those identical to the polysilsesquioxane derivative, the silica particles, the active energy ray-curable resin, and other components of the laminate of the present invention can be used.

The amount of the polysilsesquioxane derivative in the hard coat layer-forming material is preferably 0.5% by mass or greater, more preferably 1% by mass or greater, yet more preferably 3% by mass or greater, and particularly preferably 5% by mass or greater, relative to a total amount of the hard coat layer-forming material. The upper limit of the amount of the polysilsesquioxane derivative is not particularly limited, and may be appropriately selected according to the intended purpose. The upper limit is preferably 20% by mass or less, more preferably 15% by mass or less.

The amount of the silica particles in the hard coat layer-forming material is preferably 80% by mass or less, more preferably 20% by mass or greater and 60% by mass or less, relative to a total amount of the hard coat layer-forming material.

EXAMPLES

Examples of the present invention will be described hereinafter, but these examples shall not be construed as limiting the scope of the present invention in any way.

Examples 1 to 10 and Comparative Examples 1 to 3

<Preparation of Forming Hard Coat Layer-Forming Composition>

The materials presented in Tables 1 and 2 below were homogeneously mixed using a paint shaker to prepare each of hard coat layer forming compositions 1 to 10. In Tables 1 and 2, the unit for the numeric value of each component is parts by mass.

<Formation of Hard Coat Layer>

As a base, a triacetyl cellulose film (TAC, available from FUJIFILM Corporation, TD80UL, average thickness of 80 μm) or polyethylene terephthalate film (PET, available from TORAY INDUSTRIES, INC., U40, average thickness of 50 μm) was used. Each of the hard coat layer forming compositions 1 to 10 presented in Tables 1 and 2 was applied onto the base by a bar coater. The applied hard coat layer forming composition was dried for 1 minute at 70° C., followed by curing with accumulated UV dose of 250 mJ/$cm^2$, to form a hard coat layer having the average thickness presented in Tables 1 and 2 to thereby produce an intermediate laminate.

The average thickness of the hard coat layer was measured by a film thickness measuring system (F20, available from Filmetrics Japan, Inc.).

<Formation of Dry Film Layer>

Next, a glow discharge process for a surface treatment was carried out on the hard coat layer as dry processing. After the glow discharge process, an adhesion layer composed of $SiO_x$ (x=1 to 2) having a thickness of 5 nm was formed by sputtering, and an antireflection layer composed of a $Nb_2O_5$ film, $SiO_2$ film, $Nb_2O_5$ film, and $SiO_2$ film was formed on the adhesion layer by sputtering. Moreover, an anti-fouling layer formed of a perfluoropolyether group-containing alkoxysilane compound as a raw material was laminated by vapor deposition, to thereby laminate a dry film layer formed of the six layers on the hard coat layer. As described above, the laminate was produced.

Next, the following evaluations were performed on each of the obtained intermediate laminates and laminates. The results are presented in Tables 1 and 2.

<Method of Determining Abundance Ratio[(Si/C)×100]>

X-ray photoelectron spectroscopy of the surface of the hard coat layer of each of the intermediate laminates was performed to measure element ratios of C and Si. The measurement was performed 5 times to calculate average values, and the abundance ratio [(Si/C)×100] was determined from the average values.

As the X-ray photoelectron spectroscopy, Electron Spectroscopy for Chemical Analysis (ESCA) was performed by PHI5000 VersaProbeIII available from ULVAC-PHI, Inc. in the following measurement conditions. At the time of the measurement, the angle was set at 45 degrees.

[Measuring Conditions]

X-ray source: monochromator Al

X-ray gun: 50 W, 15 kV

Measuring area: 200 μm in diameter

<Blocking Resistance>

A pair of the intermediate laminates and a pair of the laminates were produced. Each of the produced intermediate laminates and laminates was cut into the size of 5 cm×5 cm. The pair of the cut intermediate laminates and the pair of the cut laminates were each stacked in a manner that the base of one of the intermediate laminates faced the other intermediate laminate, and the base of one of the laminates faced the other laminate. The stacked intermediate laminates or the stacked laminates were adhered for 30 hours with pressure of 3.0 kgf/cm$^2$, at 50° C. Then, blocking resistance was evaluated based on the following criteria.

[Evaluation Criteria]

Good: No blocking occurred

Not good: Blocking occurred

<Weather Resistance Test>

Each of the laminates was fixed on a transparent glass plate using a transparent adhesive, and the laminate was exposed to weathering conditions for 168 hours by a super xenon weather meter (SX75, available from Suga Test Instruments Co., Ltd., xenon arc lamp, 7.5 kW).

<Weather Resistance Test>

Each of the laminates was fixed on a transparent glass plate using a transparent adhesive, and the laminate was exposed to weathering conditions for 150 hours by a super xenon weather meter (SX75, available from Suga Test Instruments Co., Ltd., xenon arc lamp, 7.5 kW).

<Evaluation of Adhesion Between Layers>

On a surface of each of the initial laminate and the laminate after the above-described weather resistance test, 100 cross-hatching marks (squares) each in the size of 1 mm×1 mm were formed. After carrying out the following alcohol-wipe sliding test, the state of the cross-hatching surface was observed. Initial adhesion between the layers and adhesion between the layers after the weather resistance test were evaluated based on the following criteria.

[Alcohol Wipe Sliding Test]

A wipe to which ethyl alcohol was applied was pressed against the cross-hatching surface of the each of the laminates with a load of 250 gf/cm$^2$, and the alcohol wipe was slid along a distance of 25 mm and slid back to the original position 100 times to carry out an alcohol wipe sliding test.

[Evaluation Criteria]

Figure 2A:
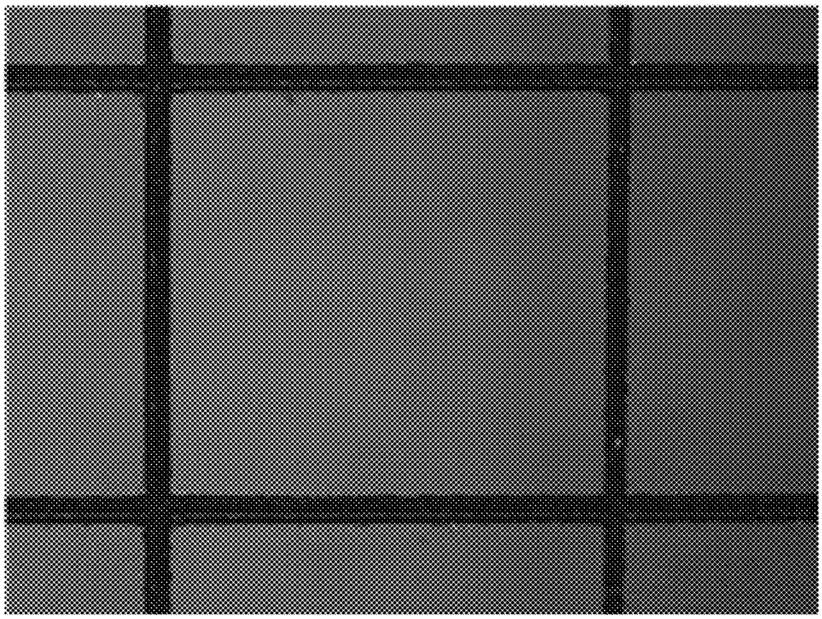
FIG. 2A is a photograph depicting the evaluation criterion "Good" of the cross-hatching test, illustrating the case where peeling did not occur.

Good: Peeling did not occur on the cross-hatched marks (see FIG. 2A)

Figure 2B:
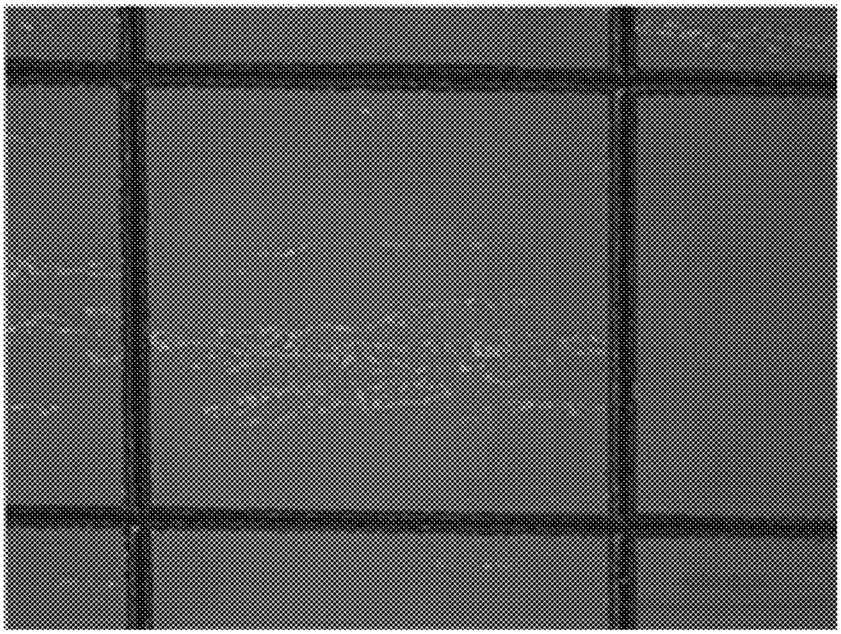
FIG. 2B is a photograph depicting the evaluation criterion “Fair” of the cross-hatching test, illustrating the case where peeling occurred partially.

Fair: Peeling occurred on part of the cross-hatched marks (see FIG. 2B)

Figure 2C:
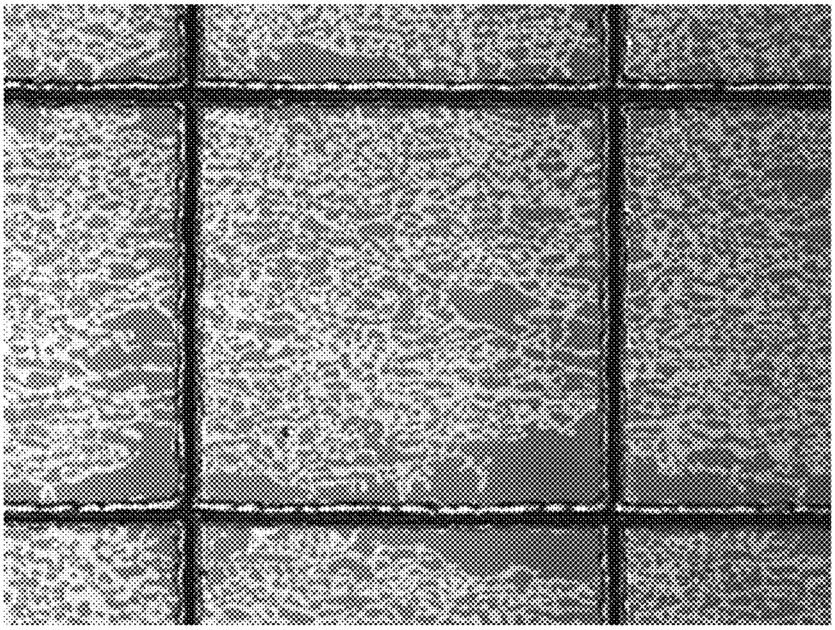
FIG. 2C is a photograph depicting the evaluation criterion “Not good” of the cross-hatching test, illustrating the case where peeling occurred entirely.

Not good: Peeling occurred on all of the cross-hatched marks (see FIG. 2C)

TABLE 1

| | Example | | | | | | |
|---|---|---|---|---|---|---|---|
| | 1 | 2 | 3 | 4 | 5 | 6 | 7 |
| Hard coat layer forming composition No. | 1 | 2 | 3 | 1 | 4 | 5 | 1 |
| Base | PET | TAC | TAC | TAC | TAC | TAC | TAC |
| Silane coupling agent 1 | — | — | — | — | — | — | — |
| Silane coupling agent 2 | — | — | — | — | — | — | — |
| Polysilsesquioxane derivative 1 | 3 | 0.5 | 1 | 3 | 5 | 10 | 3 |
| Polysilsesquioxane derivative 2 | — | — | — | — | — | — | — |
| Silica particles 1 | 133 | 133 | 133 | 133 | 133 | 133 | 133 |
| Silica particles 2 | — | — | — | — | — | — | — |
| Urethane acrylate | 30 | 30 | 30 | 30 | 30 | 30 | 30 |
| PETA | 20 | 20 | 20 | 20 | 20 | 20 | 20 |
| Polyethylene glycol diacrylate | 10 | 10 | 10 | 10 | 10 | 10 | 10 |
| Average thickness of hard coat layer (μm) | 4 | 4 | 4 | 4 | 4 | 4 | 6 |
| Abundance ratio [(Si/C) × 100] (%) | 45 | 30 | 40 | 45 | 45 | 45 | 45 |
| Initial adhesion between layers | Good | Good | Good | Good | Good | Good | Good |
| Adhesion between layers after weather resistance test | Good | Good | Good | Good | Good | Good | Good |
| Blocking resistance (intermediate laminate) | Good | Good | Good | Good | Good | Good | Good |
| Blocking resistance (laminate) | Good | Good | Good | Good | Good | Good | Good |

TABLE 2

| | Example | | | Comparative Example | | |
|---|---|---|---|---|---|---|
| | 8 | 9 | 10 | 1 | 2 | 3 |
| Hard coat layer forming composition No. | 1 | 6 | 7 | 8 | 9 | 10 |
| Base | TAC | TAC | TAC | TAC | TAC | TAC |
| Silane coupling agent 1 | — | — | — | 5 | — | — |
| Silane coupling agent 2 | — | — | — | — | 5 | — |
| Polysilsesquioxane derivative 1 | 3 | — | 3 | — | — | — |
| Polysilsesquioxane derivative 2 | — | 3 | — | — | — | — |
| Silica particles 1 | 133 | 133 | — | 133 | 133 | 133 |
| Silica particles 2 | — | — | 133 | — | — | — |
| Urethane acrylate | 30 | 30 | 30 | 30 | 30 | 30 |
| PETA | 20 | 20 | 20 | 20 | 20 | 20 |
| Polyethylene glycol diacrylate | 10 | 10 | 10 | 10 | 10 | 10 |
| Average thickness of hard coat layer (μm) | 8 | 4 | 4 | 6 | 6 | 4 |
| Abundance ratio [(Si/C) × 100] (%) | 45 | 44 | 44 | 20 | 20 | 15 |
| Initial adhesion between layers | Good | Good | Good | Fair | Good | Good |
| Adhesion between layers after weather resistance test | Good | Good | Good | Not good | Not good | Not good |
| Blocking resistance (intermediate laminate) | Good | Good | Good | Not good | Not good | Not good |
| Blocking resistance (laminate) | Good | Good | Good | Good | Good | Good |

—Polymerizable Monomer—

Urethane acrylate: U-6LPA, available from SHIN NAKAMURA CHEMICAL CO., LTD.

PETA: pentaerythritol triacrylate, PET30, available from Nippon Kayaku Co., Ltd.

Polyethylene glycol diacrylate: A600, available from SHIN NAKAMURA CHEMICAL CO., LTD.

—Silica Particles—

Silica particles 1: IPA-ST-L, available from Nissan Chemical Corporation, solid content of 30% by mass (IPA), average particle diameter: 45 nm Silica particles 2: MIBK-ST-L, available from Nissan Chemical Corporation, solid content of 30% by mass (MIBK), average particle diameter: 45 nm —Silane Coupling Agent—

Silane coupling agent 1: KR513, available from Shin-Etsu Chemical Co., Ltd.

Silane coupling agent 2: X121050, available from Shin-Etsu Chemical Co., Ltd.

—Polysilsesquioxane Derivative—

Polysilsesquioxane derivative 1: AC-SQ SI-20, available from TOAGOSEI CO., LTD.

Polysilsesquioxane derivative 2: MAC-SQ SI-20, available from TOAGOSEI CO., LTD.

It was found from the results of Table 1 and Table 2 that, compared to Comparative Example 1 to 3, in Examples 1 to 10, the abundance ratio [(Si/C)×100] of silicon atoms Si to carbon atoms C existing at the surface of the hard coat layer facing the dry film layer was increased as the polysilsesquioxane derivative was included in the hard coat layer, and adhesion between the layers improved especially after the weather resistance test.

Since the abundance ratio [(Si/C)×100] of silicon atoms Si to carbon atoms C existing at the surface of the hard coat layer facing the dry film layer was increased, moreover, blocking resistance against the back surface of the base, which was an organic layer in the intermediate laminate, was improved.

INDUSTRIAL APPLICABILITY

The laminate of the present invention has excellent blocking resistance and significantly excellent adhesion between the hard coat layer and the dry film layer formed on the hard coat layer. Therefore, the laminate can be suitably used, for example, for image display surfaces of image display devices, pointing devices (e.g., touch panels), and the like.

The present international application claims priority to Japanese Patent Application No. 2021-124950, filed on Jul. 30, 2021. The contents of Japanese Patent Application No. 2021-124950 are incorporated herein by reference in their entirety.

DESCRIPTION OF SYMBOLS

1 base
2 hard coat layer
**2*a*** metal oxide particles
3 dry film layer
10 laminate

The invention claimed is:

1. A laminate, comprising:
a base;
a hard coat layer disposed on the base; and
a dry film layer disposed on the hard coat layer,
wherein the hard coat layer includes a polysilsesquioxane derivative,
an amount of the polysilsesquioxane derivative is 0.5% by mass or greater and 5% by mass or less, relative to a total amount of the hard coat layer,
the base is a sheet or a film, and
an average thickness of the base is 15 μm or greater and 200 μm or less.

2. A method of using a laminate for outdoor use, the method comprising:
using the laminate outdoors,
wherein the laminate includes:
a base;
a hard coat layer disposed on the base; and
a dry film layer disposed on the hard coat layer,
wherein the hard coat layer includes a polysilsesquioxane derivative,
an amount of the polysilsesquioxane derivative is 0.5% by mass or greater and 5% by mass or less, relative to a total amount of the hard coat layer,
the base is a sheet or a film, and
an average thickness of the base is 15 μm or greater and 200 μm or less.

3. The laminate according to claim 1,
wherein an abundance ratio [(Si/C)×100] of silicon atoms Si to carbon atoms C existing at a surface of the hard coat layer facing the dry film layer is 40% or greater.

4. The laminate according to claim 1,
wherein the hard coat layer further includes metal oxide particles and a binder resin.

5. The laminate according to claim 4,
wherein the binder resin includes an active energy ray-curable resin.

6. The laminate according to claim 4,
wherein the metal oxide particles are silica particles.

7. The laminate according to claim 1,
wherein an average thickness of the hard coat layer is 1 μm or greater.

8. The laminate according to claim 1,
wherein the dry film layer includes high refractive index layers and low refractive index layers that are alternately laminated.

9. The laminate according to claim 1,
wherein the laminate is in a roll form or a single plate form.

10. The method of using the laminate for outdoor use according to claim 2, wherein an abundance ratio [(Si/C)×100] of silicon atoms Si to carbon atoms C existing at a surface of the hard coat layer facing the dry film layer is 30% or greater.

11. The laminate according to claim 1,
wherein an abundance ratio [(Si/C)×100] of silicon atoms Si to carbon atoms C existing at a surface of the hard coat layer facing the dry film layer is 30% or greater.

* * * * *